United States Patent
Hong

(10) Patent No.: US 10,332,829 B2
(45) Date of Patent: Jun. 25, 2019

(54) STACKED SEMICONDUCTOR APPARATUS AND SEMICONDUCTOR SYSTEM

(71) Applicant: SK hynix Inc., Icheon-si Gyeonggi-do (KR)

(72) Inventor: Yun Gi Hong, Yongin-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/000,351

(22) Filed: Jun. 5, 2018

(65) Prior Publication Data

US 2019/0148285 A1    May 16, 2019

(30) Foreign Application Priority Data

Nov. 13, 2017   (KR) .................. 10-2017-0150573

(51) Int. Cl.

| | |
|---|---|
| *H01L 25/065* | (2006.01) |
| *H01L 23/50* | (2006.01) |
| *H01L 27/11582* | (2017.01) |
| *G11C 29/24* | (2006.01) |
| *H01L 27/11556* | (2017.01) |
| *G11C 16/06* | (2006.01) |
| *H01L 23/528* | (2006.01) |

(52) U.S. Cl.
CPC .............. *H01L 23/50* (2013.01); *G11C 16/06* (2013.01); *G11C 29/24* (2013.01); *H01L 23/5286* (2013.01); *H01L 27/11556* (2013.01); *H01L 27/11582* (2013.01)

(58) Field of Classification Search
CPC ......... G11C 16/06; G11C 29/24; H01L 23/50; H01L 23/5286; H01L 27/11556; H01L 27/11582
See application file for complete search history.

(56) References Cited

U.S. PATENT DOCUMENTS

| | | | | |
|---|---|---|---|---|
| 6,556,658 | B2 * | 4/2003 | Brennan | ........... H01L 21/76838 257/E21.582 |
| 8,897,053 | B1 * | 11/2014 | Stephens, Jr. | ..... G11C 11/40615 365/63 |
| 9,230,614 | B2 * | 1/2016 | Schaefer | ................... G11C 7/00 |
| 2014/0252606 | A1 * | 9/2014 | Morimoto | ............. H01L 23/481 257/737 |
| 2014/0346678 | A1 * | 11/2014 | DeLaCruz | .......... H01L 23/5384 257/774 |
| 2018/0095127 | A1 * | 4/2018 | Pappu | ................ G01R 31/2853 |
| 2018/0350684 | A1 * | 12/2018 | Mandal | ................... H01L 24/97 |

FOREIGN PATENT DOCUMENTS

KR   101143443  B1   5/2012

* cited by examiner

*Primary Examiner* — Alexander H Taningco
*Assistant Examiner* — Kurtis R Bahr
(74) *Attorney, Agent, or Firm* — William Park & Associates Ltd.

(57) ABSTRACT

A semiconductor apparatus may include a through via and a redundancy through via which couple a first chip and a second chip. A transmission circuit may perform a repair operation for the through via with the redundancy through via or supply the redundancy through via with a power supply voltage based on through via defect information.

20 Claims, 8 Drawing Sheets

STACKED SEMICONDUCTOR APPARATUS AND SEMICONDUCTOR SYSTEM

CROSS-REFERENCES TO RELATED APPLICATION

The present application claims priority under 35 U.S.C. § 119(a) to Korean application number 10-2017-0150573, filed on Nov. 13, 2017, in the Korean Intellectual Property Office, which is incorporated herein by reference in its entirety.

BACKGROUND

1. Technical Field

Various embodiments generally relate to a semiconductor technology, and, more particularly, to a stacked semiconductor apparatus and a semiconductor system.

2. Related Art

In order to improve the degree of integration of a semiconductor apparatus, a 3D (three-dimensional) semiconductor apparatus, in which a plurality of chips are stacked and packaged in a single package, has been developed. In the 3D semiconductor apparatus, as two or more chips are vertically stacked, it is possible to achieve a maximum degree of integration within the same area. Various methods may be applied to realize the 3D semiconductor apparatus. In one of the methods, a plurality of chips having the same structure are stacked and are electrically coupled with one another using wires such as metal lines to operate as one semiconductor apparatus.

Recently, a TSV (through-silicon via) type semiconductor apparatus has been disclosed in the art, in which vias are formed to pass through a plurality of stacked chips such that all the chips are electrically coupled with one another. In the TSV type semiconductor apparatus, because the vias vertically pass through the respective chips to electrically couple them with one another, the area of a package may be efficiently reduced when compared to a semiconductor apparatus in which respective chips are electrically coupled with one another through peripheral wiring using wires.

SUMMARY

In an embodiment, a semiconductor apparatus may include a normal through via and a redundancy through via coupling a first chip and a second chip. The semiconductor apparatus may include a transmission circuit configured to detour a transmission signal which is allocated to be transmitted through the normal through via, to the redundancy through via, when a defect exists in the normal through via, and drive the redundancy through via with a power supply voltage, when a defect does not exist in the normal through via.

In an embodiment, a semiconductor apparatus may include a first through via, a second through via and a redundancy through via coupling a first chip and a second chip. The semiconductor apparatus may include a first transmission circuit configured to detour a first transmission signal which is allocated to be transmitted through the second through via, to the redundancy through via, when a defect exists in any one of the first and second through vias, and drive the redundancy through via with a power supply voltage when a defect does not exist in the first and second through vias.

In an embodiment, a semiconductor apparatus may include a first through via disposed in a first channel and coupling a first chip and a second chip. The semiconductor apparatus may include a first transmission circuit configured to transmit a first signal through the first through via based on the first channel being activated and supply a power supply voltage through the first through via based on the first channel being deactivated.

In an embodiment, a semiconductor apparatus may include a through via and a redundancy through via which couple a first chip and a second chip. A transmission circuit may perform a repair operation for the through via with the redundancy through via or supply the redundancy through via with a power supply voltage based on through via defect information.

DETAILED DESCRIPTION

Hereinafter, a stacked semiconductor apparatus and a semiconductor system will be described below with reference to the accompanying drawings through various examples of embodiments.

Various embodiments may be directed to a stacked semiconductor apparatus including through vias and transmission circuits capable of repairing a defected through via or additionally supplying power.

Figure 1:
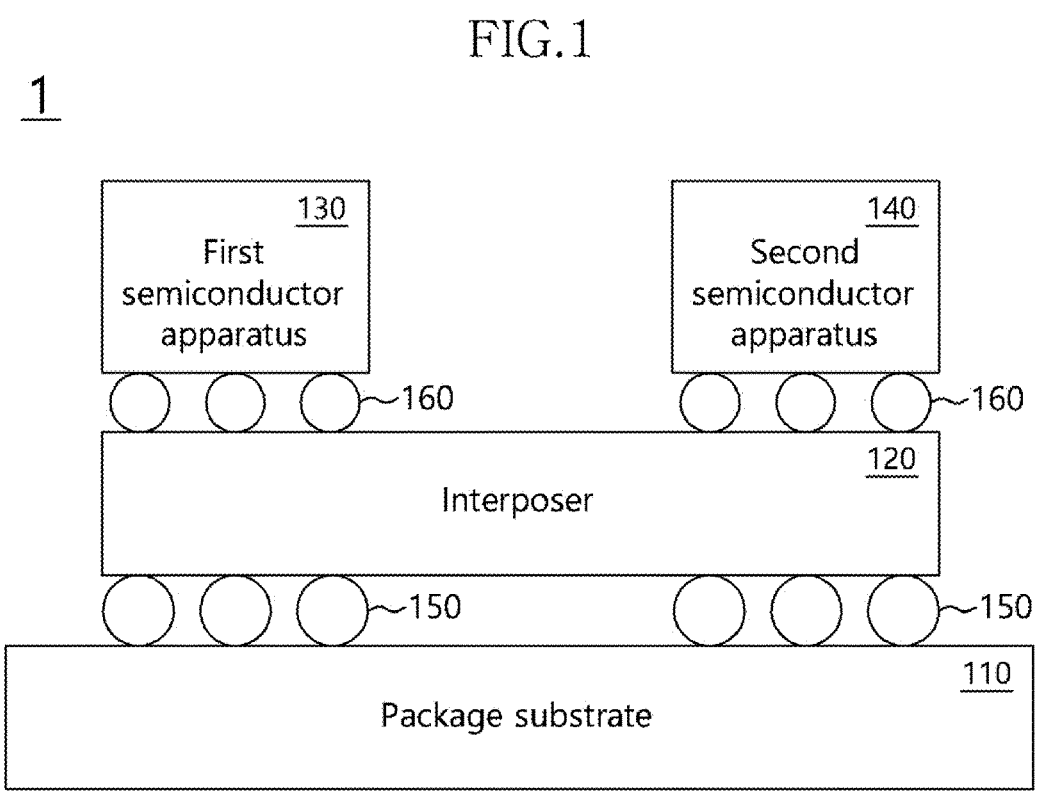
FIG. 1 is a diagram illustrating a representation of an example of the configuration of a semiconductor system in accordance with an embodiment.

In FIG. 1, a semiconductor system 1 in accordance with an embodiment may include a package substrate 110, an interposer 120, a first semiconductor apparatus 130 and a second semiconductor apparatus 140. The interposer 120 may be stacked on the package substrate 110. The interposer 120 and the package substrate 110 may be coupled with each other through electrical coupling means 150 such as bump balls, a ball grid array or C4 bumps. Signal paths through which signals are to be transmitted may be formed in the interposer 120 and the package substrate 110. While not shown, the package substrate 110 may include package balls (not shown), and the semiconductor system 1 may be coupled with an external electronic apparatus through the package balls.

The first semiconductor apparatus 130 and the second semiconductor apparatus 140 may be stacked on the interposer 120, and may be coupled with the interposer 120 through microbumps 160. The first semiconductor apparatus 130 and the second semiconductor apparatus 140 may communicate with each other through the signal paths which are formed in the interposer 120. The components of the semiconductor system 1 may be packaged into a single package, and may be realized in the form of a system-on-chip (SOC), a system-in-package (SIP), a multi-chip package or a flip chip package.

The first semiconductor apparatus 130 may be a master apparatus which controls the second semiconductor apparatus 140. The first semiconductor apparatus 130 may be a central processing unit (CPU), a graphic processing unit (GPU), a digital signal processor (DSP), an application processor (AP), a controller chip or a memory controller chip.

The second semiconductor apparatus 140 may be a slave apparatus which is controlled by the first semiconductor apparatus 130. The second semiconductor apparatus 140 may be a volatile memory such as a DRAM or may be a nonvolatile memory such as a flash memory, a phase change random access memory (PCRAM), a resistive random access memory (ReRAM), a ferroelectric random access memory (FeRAM), a magnetic random access memory (MRAM) and a spin transfer torque random access memory (STTRAM). Alternatively, the second semiconductor apparatus 140 may be configured by a combination of at least two among volatile memories and nonvolatile memories. In an embodiment, the second semiconductor apparatus 140 may be a stacked memory apparatus which includes a plurality of chips.

Figure 2:
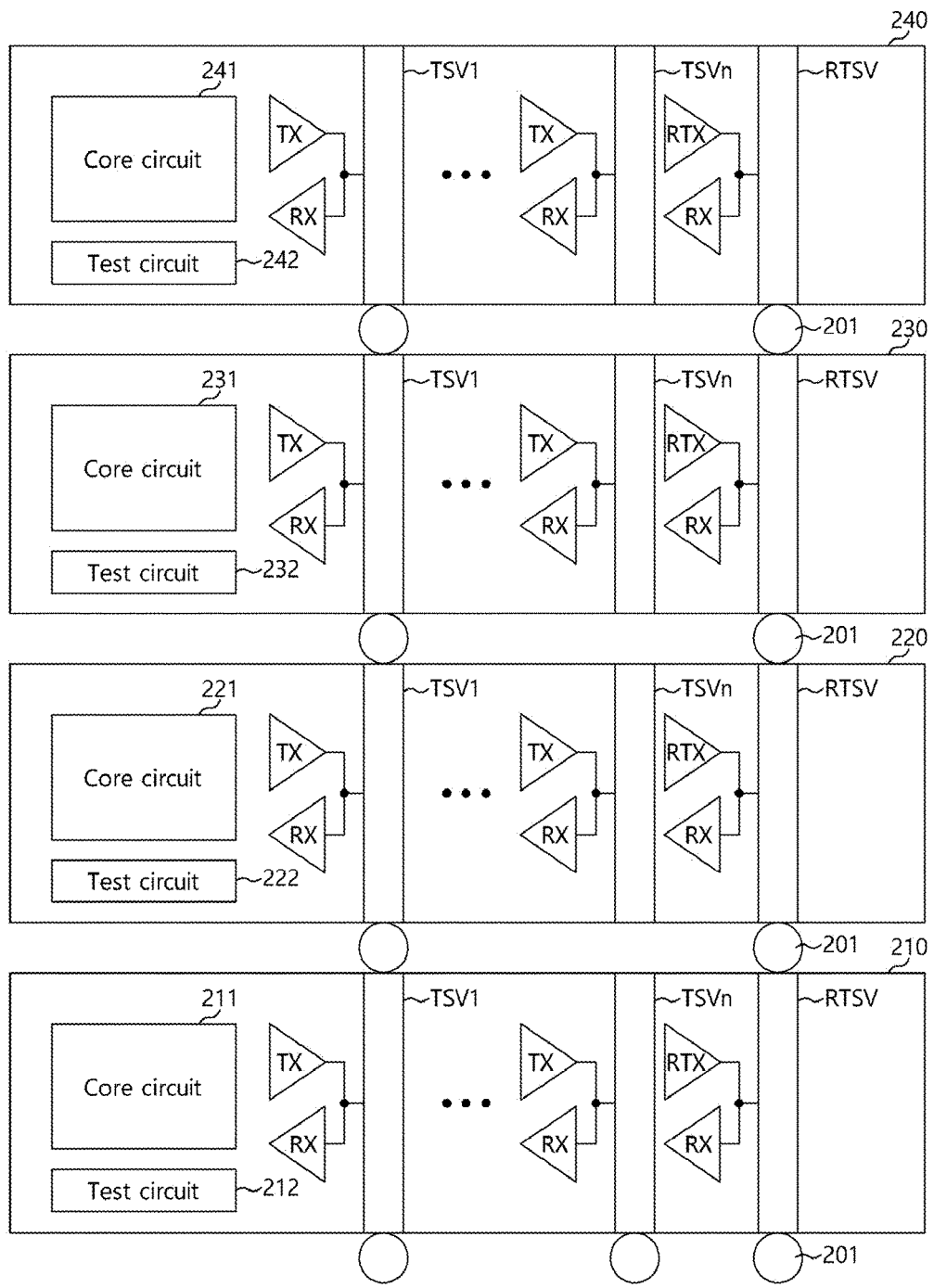
FIG. 2 is a diagram illustrating a representation of an example of the configuration of a semiconductor apparatus in accordance with an embodiment.

FIG. 2 is a diagram illustrating a representation of an example of the configuration of a semiconductor apparatus 2 in accordance with an embodiment. In FIG. 2, the semiconductor apparatus 2 may be applied as any one of the first and second semiconductor apparatuses 130 and 140. Hereunder, a case where the semiconductor apparatus 2 is applied as the second semiconductor apparatus 140 will be described as an example. The semiconductor apparatus 2 may include a plurality of chips. The plurality of chips may be stacked upon one another and may configure a single semiconductor apparatus. While it is illustrated in FIG. 2 that four chips 210, 220, 230 and 240 having the same structure are stacked, it is to be noted that two, eight or 16 chips may be stacked. The first to fourth chips 210, 220, 230 and 240 may be the same kind of chips, or the first chip 210 stacked at the bottom or the fourth chip 240 stacked at the top may have a structure different from the other chips. A plurality of through vias TSV1, TSVn and RTSV (n is an integer of 2 or more) may be formed in the respective first to fourth chips 210, 220, 230 and 240, and the first to fourth chips 210, 220, 230 and 240 may be electrically coupled through the plurality of through vias TSV1, TSVn and RTSV. The plurality of through vias TSV1, TSVn and RTSV may electrically couple one chip and another chip through microbumps 201. The plurality of through vias TSV1, TSVn and RTSV may include one or more normal through vias and at least one redundancy through via.

The first chip 210 may include a core circuit 211, a first through via TSV1, an n^th through via TSVn and a redundancy through via RTSV. The core circuit 211 may include a configuration and circuits for storing and outputting data. While not shown, the core circuit 211 may include a memory cell array which includes a plurality of memory cells for storing data, a circuit for storing data in the memory cell array, a circuit for outputting data stored in the memory cell array, and so forth. The first through via TSV1 and the n^th through via TSVn may be normal through vias, and may be signal paths capable of transmitting transmission signals allocated thereto, respectively. For example, the allocated transmission signals may be data, and the data may be outputted from the core circuit 211 or may be received from an external apparatus, for example, the first semiconductor apparatus 130 shown in FIG. 1. The redundancy through via RTSV may be a signal path capable of transmitting a signal by replacing the first or n^th through via TSV1 or TSVn to perform a repair operation when a defect has occurred in the first or n^th through via TSV1 or TSVn. Each of the first and n^th through vias TSV1 and TSVn may be coupled with a transmission circuit TX and a receiving circuit RX. The redundancy through via RTSV may be coupled with a transmission circuit RTX and a receiving circuit RX. The transmission circuits TX and RTX of the first chip 210 may drive the respective through vias TSV1, TSVn and RTSV based on the signal outputted from the core circuit 211. The receiving circuits RX of the first chip 210 may receive the signals transmitted through the respective through vias TSV1, TSVn and RTSV and may provide the received signals to the core circuit 211. The transmission circuits TX and RTX of the second chip 220 may drive the respective through vias TSV1, TSVn and RTSV based on the signal outputted from a core circuit 221. The receiving circuits RX of the second chip 220 may receive the signals transmitted through the respective through vias TSV1, TSVn and RTSV and may provide the received signals to the core circuit 221. The transmission circuits TX and RTX of the third chip 230 may drive the respective through vias TSV1, TSVn and RTSV based on the signal outputted from a core circuit 231. The receiving circuits RX of the third chip 230 may receive the signals transmitted through the respective through vias TSV1, TSVn and RTSV and may provide the received signals to the core circuit 231. The transmission circuits TX and RTX of the fourth chip 240 may drive the respective through vias TSV1, TSVn and RTSV based on the signal outputted from a core circuit 241. The receiving circuits RX of the fourth chip 240 may receive the signals transmitted through the respective through vias TSV1, TSVn and RTSV and may provide the received signals to the core circuit 241. While the signals transmitted through the through vias TSV1, TSVn and RTSV may include command signals, address signals, clock signals and data signals, they may be bidirectional transmission signals such as data. The transmission circuit RTX coupled with the redundancy through via RTSV may detour, when a defect exists in the normal through via TSV1 or TSVn, a transmission signal to be transmitted through the normal through via TSV1 or TSVn, to the redundancy through via RTSV. The transmission circuit RTX may control, when a defect has occurred in any one of the first and n^th normal through vias TSV1 and TSVn, the redundancy through via RTSV to transmit a transmission signal in replacement of the normal through via TSV1 or TSVn in which the defect has occurred. The transmission circuit RTX may drive, when a defect does not exist in the first and n^th normal through vias TSV1 and TSVn and the redundancy through via RTSV is acting like a dummy which does not transmit any signal for any one of the first and n^th normal through vias TSV1 and TSVn, the redundancy through via RTSV with a power supply voltage.

Similarly to the first chip 210, the second to fourth chips 220, 230 and 240 may include the core circuits 221, 231 and 241, the first through vias TSV1, the n^th through vias TSVn and the redundancy through vias RTSV. Each of the first through vias TSV1 and the n^th through vias TSVn of the second to fourth chips 220, 230 and 240 may be coupled with a transmission circuit TX and a receiving circuit RX. Each of the redundancy through vias RTSV of the second to fourth chips 220, 230 and 240 may be coupled with a transmission circuit RTX and a receiving circuit RX.

The first to fourth chips 210, 220, 230 and 240 may include test circuits 212, 222, 232 and 242, respectively. The test circuits 212, 222, 232 and 242 may be circuits capable of testing whether a defect has occurred in the normal through vias TSV1 and TSVn of the first to fourth chips 210, 220, 230 and 240. The test circuits 212, 222, 232 and 242 may generate a through via defect information by performing an open/short test for the first and n^th through vias TSV1 and TSVn of the first to fourth chips 210, 220, 230 and 240 and monitoring a through via in which a defect has occurred. The transmission circuits TX and RTX may perform a repair operation based on the through via defect information.

Figure 3A:
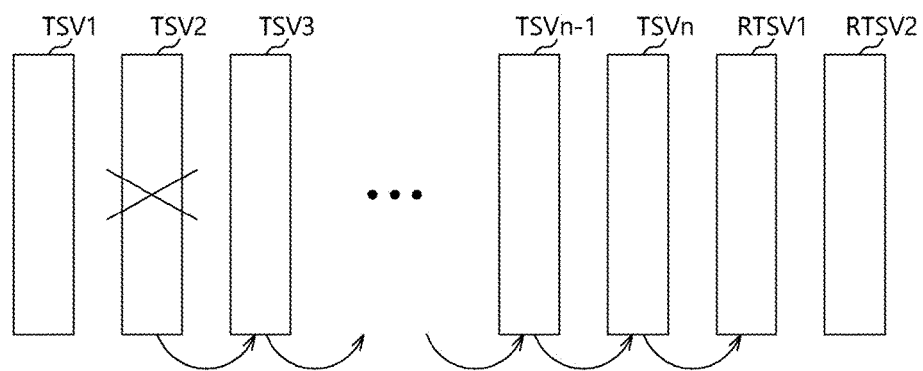
FIGS. 3A and 3B are representations of examples of diagrams to assist in the explanation of the concept of the repair operation of a semiconductor apparatus in accordance with an embodiment.
Figure 3B:
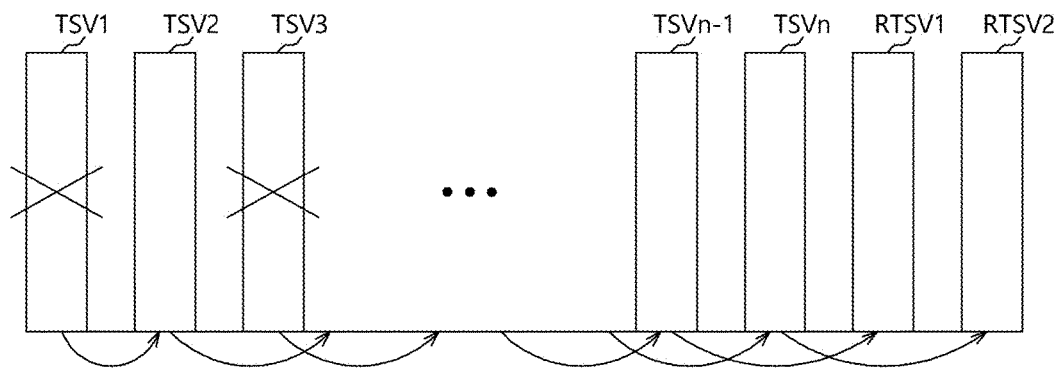

FIGS. 3A and 3B are representations of examples of diagrams to assist in the explanation of the concept of the repair operation of a semiconductor apparatus in accordance with an embodiment. In FIGS. 3A and 3B, it is illustrated as an example that one chip includes n number of normal through vias TSV1 to TSVn and two redundancy through vias RTSV1 and RTSV2. The first to n^th through vias TSV1 to TSVn may transmit transmission signals allocated thereto, respectively. As shown in FIG. 3A, in the case where a defect has occurred in the second through via TSV2, since the second through via TSV2 cannot normally transmit a transmission signal allocated thereto, a repair operation for changing a signal path is required. Thus, the transmission signal allocated to be transmitted through the second through via TSV2 may be detoured to be transmitted through the third through via TSV3. Transmission signals allocated to be transmitted through the third to n^th through vias TSV3 to TSVn may be transmitted, through detouring, by being shifted to the fourth to n^th through vias TSV4 to TSVn and the first redundancy through via RTSV1 which are adjacent rightward to the third to n^th through vias TSV3 to TSVn, respectively. In this case, the second redundancy through via RTSV2 may be a dummy which does not transmit any signal.

As shown in FIG. 3B, in the case where defects have occurred in the first and third through vias TSV1 and TSV3, the second through via TSV2 may transmit, through detouring, a transmission signal allocated to be transmitted through the first through via TSV1, and the fourth through via TSV4 which is adjacent to the third through via TSV3 may transmit, through detouring, a transmission signal allocated to be transmitted through the second through via TSV2. Transmission signals allocated to be transmitted through the third to n^th through vias TSV3 to TSVn may be transmitted in a detoured manner through the fifth to n^th through vias TSV5 to TSVn and the first and second redundancy through vias RTSV1 and RTSV2, respectively.

Figure 4:
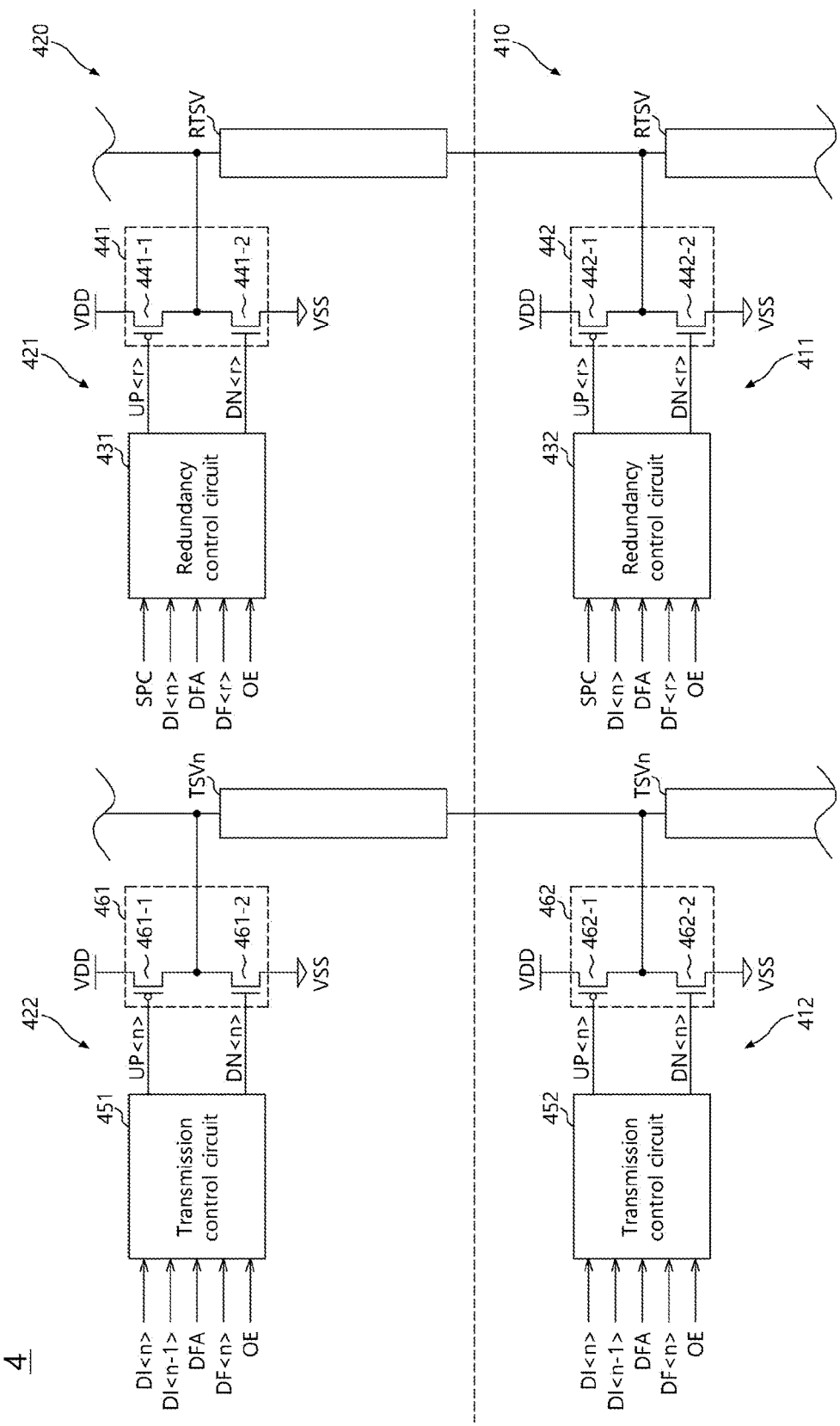
FIG. 4 is a diagram illustrating a representation of an example of the partial configuration of a semiconductor apparatus in accordance with an embodiment.

The transmission circuits TX and RTX shown in FIG. 2 may perform a repair operation by detouring signal paths when a defect has occurred in a normal through via as shown in FIG. 3A or defects have occurred in normal through vias as shown in FIG. 3B. The transmission circuit RTX which is coupled with the redundancy through via RTSV may drive the redundancy through via RTSV (i.e., RTSV2) with a power supply voltage when the redundancy through via RTSV is not used and acts as a dummy which does not transmit any signal, as shown in FIG. 3A. Referring again to FIG. 2, the semiconductor apparatus 2 may receive a power supply voltage from the external apparatus, and the power supply voltage may be supplied to the first to fourth chips 210, 220, 230 and 240 through other through vias. The fourth chip 240 which is stacked relatively at the top may deteriorate in a power distribution network due to problems such as a voltage drop and a delay. A chip which deteriorates in the power distribution network may have a problem in that performance degrades. The semiconductor apparatus 2 in accordance with the embodiment may improve the power distribution network by causing the redundancy through via RTSV which is not used, to be used as a through via for supplying a power supply voltage FIG. 4 is a diagram illustrating a representation of an example of the configuration of a semiconductor apparatus 4 in accordance with an embodiment. In FIG. 4, for the sake of clarity in explanation, one normal through via and one redundancy through via which couple two chips are illustrated. The semiconductor apparatus 4 may include a first chip 410 and a second chip 420. The semiconductor apparatus 4 may include normal through vias TSVn (n is an integer of 2 or more) and redundancy through vias RTSV which couple the first and second chips 410 and 420. The redundancy through via RTSV of the first chip 410 may be coupled with a transmission circuit 411, and the redundancy through via RTSV of the second chip 420 may be coupled with a transmission circuit 421. The first chip 410 may have substantially the same structure as the second chip 420, and the transmission circuit 421 included in the second chip 420 will be described representatively. The second chip 420 may include the transmission circuit 421. The transmission circuit 421 may be applied as each of the transmission circuits RTX which are coupled with the redundancy through vias RTSV shown in FIG. 2. The transmission circuit 421 may be coupled with the redundancy through via RTSV, and may drive the redundancy through via RTSV. The transmission circuit 421 may provide a detour, when a defect exists in the normal through via TSVn, for a transmission signal allocated to be transmitted through the normal through via TSVn, to the redundancy through via RTSV. The transmission circuit 421 may drive, when a defect does not exist in the normal through vias TSVn, the redundancy through via RTSV with a power supply voltage.

The transmission circuit 421 may include a redundancy control circuit 431 and a transmission driver 441. The redundancy control circuit 431 may receive through via defect information DFA and DF<r>, a transmission signal DI<n> and a supplemental power control signal SPC. The redundancy control circuit 431 may generate driving control signals UP<r> and DN<r> based on one of the transmission signal DI<n> and the supplemental power control signal SPC according to the through via defect information DFA and DF<r>. The redundancy control circuit 431 may generate the driving control signals UP<r> and DN<r> based on the transmission signal DI<n> when a defect exists in the normal through via TSVn, and may generate the driving control signals UP<r> and DN<r> based on the supplemental power control signal SPC when a defect does not exist in the normal through via TSVn. The transmission circuit 421 may further receive an output enable signal OE. The output enable signal OE may be enabled at a time when the transmission signal DI<n> is actually transmitted through the normal through vias TSVn or the redundancy through vias RTSV of the first and second chips 410 and 420. When a defect exists in the normal through via TSVn, the redundancy control circuit 431 may generate the driving control signals UP<r> and DN<r> to transmit the transmission signal DI<n> through the redundancy through via RTSV based on the output enable signal OE. When a defect does not exist in the normal through via TSVn, the redundancy control circuit 431 may drive the redundancy through via RTSV with a power supply voltage regardless of the output enable signal OE.

The transmission driver 441 may drive the redundancy through via RTSV based on the driving control signals UP<r> and DN<r>. The driving control signals UP<r> and DN<r> may include a pull-up signal UP<r> and a pull-down signal DN<r>, and the transmission driver 441 may drive the redundancy through via RTSV with a first power supply voltage VDD and a second power supply voltage VSS based on the pull-up signal UP<r> and the pull-down signal DN<r>. The first power supply voltage VDD as a high voltage may correspond to a power supply voltage applied from an external apparatus, and the second power supply voltage VSS as a low voltage may correspond to a ground voltage. However, it is not intended that the kinds of the first and second power supply voltages VDD and VSS be specified, and any voltage may be used as the first power supply voltage VDD as long as it is a voltage of a level higher than the second power supply voltage VSS. The transmission driver 441 may include a pull-up driver 441-1 and a pull-down driver 441-2. The pull-up driver 441-1 may drive the redundancy through via RTSV with the first power supply voltage VDD based on the pull-up signal UP<r>. The pull-down driver 441-2 may drive the redundancy through via RTSV with the second power supply voltage VSS based on the pull-down signal DN<r>. Similarly to the transmission circuit 421, the transmission circuit 411 may include a redundancy control circuit 432 and a transmission driver 442. The transmission driver 442 may include a pull-up driver 442-1 and a pull-down driver 442-2.

The semiconductor apparatus 4 may further include transmission circuits 412 and 422. The transmission circuits 412 and 422 may be disposed in the first and second chips 410 and 420, respectively, and may be coupled with the normal through vias TSVn, respectively, of the first and second chips 410 and 420. The transmission circuit 422 included in the second chip 420 will be described representatively. The transmission circuit 422 may be applied as each of the transmission circuits TX which are coupled with the first and n^th through vias TSV1 and TSVn shown in FIG. 2. The transmission circuit 422 may detour, when a defect exists in the normal through via TSVn, the transmission signal DI<n> allocated to be transmitted through the normal through via TSVn, to the redundancy through via RTSV. The transmission circuit 422 may drive, when a defect does not exist in the normal through via TSVn, the normal through via TSVn based on the transmission signal DI<n> allocated to be transmitted through the normal through via TSVn. The semiconductor apparatus 4 may further include a plurality of normal through vias as shown in FIGS. 2, 3A and 3B. When a defect exists in any one of the plurality of normal through vias, the transmission circuit 422 may drive the normal through via TSVn based on a transmission signal DI<n-1> allocated to be transmitted through an adjacent normal through via.

The transmission circuit 422 may include a transmission control circuit 451 and a transmission driver 461. The transmission control circuit 451 may receive through via defect information DFA and DF<n>, the transmission signal DI<n-1> allocated to be transmitted through the adjacent normal through via and the transmission signal DI<n> allocated to be transmitted through the normal through via TSVn. The transmission control circuit 451 may generate driving control signals UP<n> and DN<n> based on one of the transmission signal DI<n-1> allocated to be transmitted through the adjacent normal through via and the transmission signal DI<n> allocated to be transmitted through the normal through via TSVn according to the through via defect information DFA and DF<n>. For example, when a defect exists in any one of the plurality of through vias, the transmission control circuit 451 may generate the driving control signals UP<n> and DN<n> based on the transmission signal DI<n-1> allocated to be transmitted through the adjacent normal through via. When a defect does not exist in the plurality of through vias and the normal through via TSVn, the transmission control circuit 451 may generate the driving control signals UP<n> and DN<n> based on the transmission signal DI<n> allocated to be transmitted through the normal through via TSVn.

The transmission driver 461 may drive the normal through via TSVn based on the driving control signals UP<n> and DN<n>. The driving control signals UP<n> and DN<n> may include a pull-up signal UP<n> and a pull-down signal DN<n>, and the transmission driver 461 may include a pull-up driver 461-1 and a pull-down driver 461-2. The pull-up driver 461-1 may drive the normal through via TSVn with the first power supply voltage VDD based on the pull-up signal UP<n>. The pull-down driver 461-2 may drive the normal through via TSVn with the second power supply voltage VSS based on the pull-down signal DN<n>. Similarly to the transmission circuit 422, the transmission circuit 412 may include a transmission control circuit 452 and a transmission driver 462. The transmission driver 462 may include a pull-up driver 462-1 and a pull-down driver 462-2.

When a defect does not exist in the plurality of through vias including the normal through via TSVn, the redundancy control circuits 431 and 432 may generate the driving control signals UP<r> and DN<r> based on the supplemental power control signal SPC, and the transmission drivers 441 and 442 may drive the redundancy through vias RTSV with one of the first power supply voltage VDD and the second power supply voltage VSS. For example, the transmission circuits 411 and 421 may drive the redundancy through vias RTSV with the first power supply voltage VDD by turning on the pull-up drivers 442-1 and 441-1 of the transmission drivers 442 and 441, and the redundancy through vias RTSV driven with the first power supply voltage VDD may supply additional power to a power mesh to which the terminal of the first power supply voltage VDD is coupled. Also, the transmission circuits 411 and 421 may drive the redundancy through vias RTSV with the second power supply voltage VSS by turning on the pull-down drivers 442-2 and 441-2 of the transmission drivers 442 and 441, and the redundancy through vias RTSV driven with the second power supply voltage VSS may supply additional power to a power mesh to which the terminal of the second power supply voltage VSS is coupled. Accordingly, the power distribution network of the semiconductor apparatus 4 may be improved, and the performance and reliability of the semiconductor apparatus 4 may be improved.

Figure 5:
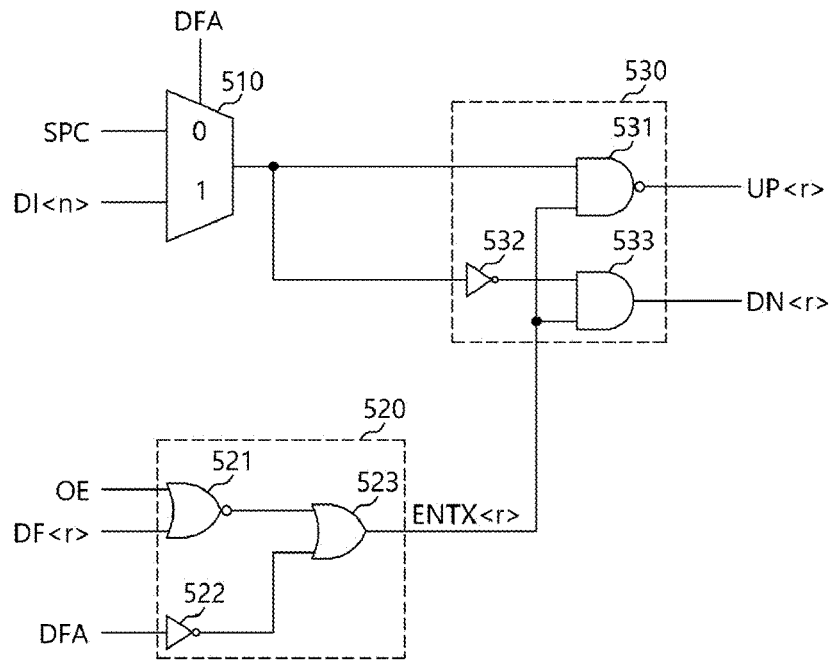
FIG. 5 is a diagram illustrating a representation of an example of the configuration of the redundancy control circuit shown in FIG. 4.

FIG. 5 is a diagram illustrating a representation of an example of the configuration of the redundancy control circuit 431 shown in FIG. 4. In FIG. 5, the redundancy control circuit 431 may include a multiplexer 510, a driver enable circuit 520 and a driving control signal generation circuit 530. The through via defect information DFA and DF<r> may include an entire defect information DFA and an individual defect information DF<r>. The entire defect information DFA may be disabled to a low level when a defect does not exist in the plurality of through vias including the normal through via TSVn, and may be enabled to a high level when a defect exists in even any one of the plurality of through vias. The individual defect information DF<r> is an individual information on a through via in which a defect exists. For example, when a defect exists in the redundancy through via RTSV, the individual defect information DF<r> associated with the redundancy through via RTSV may be enabled to a high level. The multiplexer 510 may output one of the transmission signal DI<n> allocated to be transmitted through the normal through via TSVn and the supplemental power control signal SPC based on the entire defect information DFA. The supplemental power control signal SPC may be one of the first power supply voltage VDD and the second power supply voltage VSS.

The driver enable circuit 520 may generate a driver enable signal ENTX<r> based on the output enable signal OE and the individual defect information DF<r> or generate the driver enable signal ENTX<r> based on the entire defect information DFA. The output enable signal OE may be enabled to a low level at a time when the transmission signal DI<n> is actually transmitted. The driver enable circuit 520 may include, for example but not limited to, a NOR gate 521, an inverter 522 and an OR gate 523. The NOR gate 521 may receive the output enable signal OE and the individual defect information DF<r>. The inverter 522 may invert the entire defect information DFA and output an output. The OR gate 523 may receive the output of the NOR gate 521 and the output of the inverter 522, and generate the driver enable signal ENTX<r>. The driver enable circuit 520 may enable the driver enable signal ENTX<r> to a high level when the output enable signal OE is enabled to the low level and the individual defect information DF<r> is disabled to a low level. Also, the driver enable circuit 520 may enable the driver enable signal ENTX<r> to the high level when the entire defect information DFA is disabled to the low level.

The driving control signal generation circuit 530 may generate the driving control signals UP<r> and DN<r> based on the output of the multiplexer 510 and the driver enable signal ENTX<r>. The driving control signal generation circuit 530 may include, for example but not limited to, a NAND gate 531, an inverter 532 and an AND gate 533. The NAND gate 531 may receive the output of the multiplexer 510 and the driver enable signal ENTX<r>, and generate the pull-up signal UP<r>. The inverter 532 may invert the output of the multiplexer 510 and output an output. The AND gate 533 may receive the output of the inverter 532 and the driver enable signal ENTX<r>, and generate the pull-down signal DN<r>.

The redundancy control circuit 431 and the transmission circuit 421 may operate as follows. When a defect exists in the normal through via TSVn, the entire defect information DFA may be enabled to the high level, and the individual defect information DF<r> may be disabled to the low level. The multiplexer 510 may output the transmission signal DI<n> based on the entire defect information DFA. The driver enable circuit 520 may enable the driver enable signal ENTX<r> to the high level when the output enable signal OE is enabled to the low level. When the transmission signal DI<n> is a high level, the driving control signal generation circuit 530 may enable the pull-up signal UP<r> to a low level and disable the pull-down signal DN<r> to a low level. When the transmission signal DI<n> is a low level, the driving control signal generation circuit 530 may disable the pull-up signal UP<r> to a high level and enable the pull-down signal DN<r> to a high level. According to this fact, the pull-up signal UP<r> and the pull-down signal DN<r> may be outputted in conformity with a timing at which the output enable signal OE is enabled, and the transmission driver 441 may drive the redundancy through via RTSV with one of the first and second power supply voltages VDD and VSS. Therefore, the transmission signal DI<n> may be transmitted through the redundancy through via RTSV which replaces the normal through via TSVn.

When a defect does not exist in the normal through via TSVn and the redundancy through via RTSV, both the entire defect information DFA and the individual defect information DF<r> may be disabled to the low levels. The multiplexer 510 may output the supplemental power control signal SPC based on the entire defect information DFA which is disabled to the low level. The driver enable circuit 520 may enable the driver enable signal ENTX<r> to the high level regardless of the output enable signal OE based on the entire defect information DFA which is disabled to the low level. The driving control signal generation circuit 530 may enable one of the pull-up signal UP<r> and the pull-down signal DN<r> based on the supplemental power control signal SPC, and the transmission driver 441 may drive the redundancy through via RTSV with one of the first and second power supply voltages VDD and VSS. Therefore, the redundancy through via RTSV may supply additional power to the terminal of the first power supply voltage VDD and the terminal of the second power supply voltage VSS, thereby improving the power distribution network.

Figure 6:
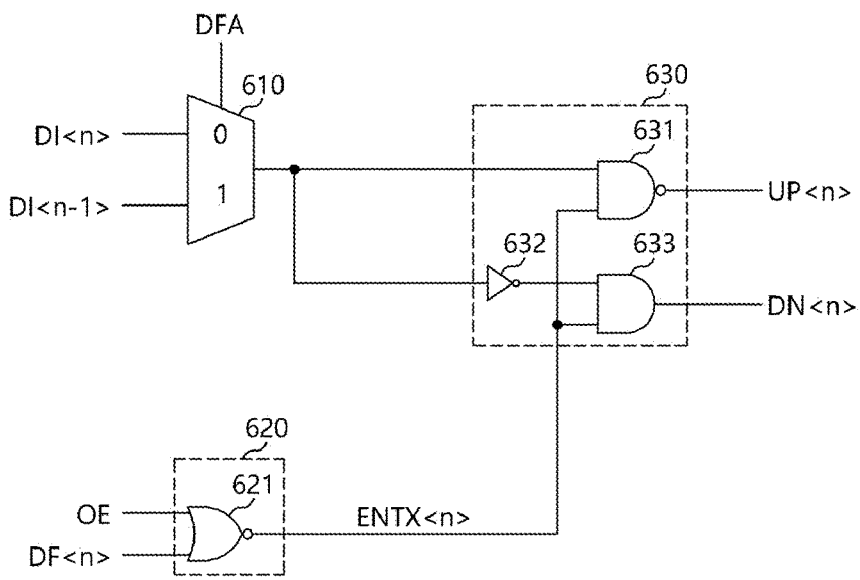
FIG. 6 is a diagram illustrating a representation of an example of the configuration of the transmission control circuit shown in FIG. 4.

FIG. 6 is a diagram illustrating a representation of an example of the configuration of the transmission control circuit 451 shown in FIG. 4. In FIG. 6, the transmission control circuit 451 may include a multiplexer 610, a driver enable circuit 620 and a driving control signal generation circuit 630. The multiplexer 610 may receive the transmission signal DI<n-1> allocated to be transmitted through the adjacent normal through via, the transmission signal DI<n> allocated to be transmitted through the normal through via TSVn and the entire defect information DFA. The multiplexer 610 may output one of the transmission signal DI<n-1> and the transmission signal DI<n> based on the entire defect information DFA. The multiplexer 610 may output the transmission signal DI<n> allocated to be transmitted through the normal through via TSVn, when the entire defect information DFA is disabled to the low level, and may output the transmission signal DI<n-1> allocated to be transmitted through the adjacent normal through via, when the entire defect information DFA is enabled to the high level.

The driver enable circuit 620 may enable a driver enable signal ENTX<n> based on the output enable signal OE and the individual defect information DF<n>. The driver enable circuit 620 may include a NOR gate 621. The NOR gate 621 may enable the driver enable signal ENTX<n> to a high level when the individual defect information DF<n> is disabled to a low level and the output enable signal OE is enabled to the low level.

The driving control signal generation circuit 630 may receive the output of the multiplexer 610 and the driver enable signal ENTX<n>, and generate the driving control signals UP<n> and DN<n>. The driving control signal generation circuit 630 may include a NAND gate 631, an inverter 632 and an AND gate 633. The NAND gate 631 may receive the output of the multiplexer 610 and the driver enable signal ENTX<n>, and generate the pull-up signal UP<n>. The inverter 632 may invert the output of the multiplexer 610 and output an output. The AND gate 633 may receive the output of the inverter 632 and the driver enable signal ENTX<n>, and generate the pull-down signal DN<n>.

The transmission control circuit 451 and the transmission circuit 422 may operate as follows. When a defect exists in the normal through via TSVn, both the entire defect information DFA and the individual defect information DF<n> may be enabled to high levels. Accordingly, the driver enable circuit 620 may disable the driver enable signal ENTX<n>. The driving control signal generation circuit 630 may disable both the pull-up signal UP<n> and the pull-down signal DN<n>, and the transmission driver 461 might not drive the normal through via TSVn.

When a defect exists in any one of the plurality of through vias except the normal through via TSVn, the entire defect information DFA may be enabled to the high level, and the individual defect information DF<n> may be disabled to the low level. The multiplexer 610 may output the transmission signal DI<n−1> allocated to be transmitted through the adjacent normal through via, based on the entire defect information DFA which is enabled to the high level. Since the driver enable circuit 620 receives the individual defect information DF<n> which is disabled to the low level, the driver enable circuit 620 may enable the driver enable signal ENTX<n> to the high level when the output enable signal OE is enabled to the low level. The driving control signal generation circuit 630 may generate the pull-up signal UP<n> and the pull-down signal DN<n> based on the transmission signal DI<n−1>. When the transmission signal DI<n−1> is a high level, the driving control signal generation circuit 630 may enable the pull-up signal UP<n> to a low level and disable the pull-down signal DN<n> to a low level. When the transmission signal DI<n−1> is a low level, the driving control signal generation circuit 630 may disable the pull-up signal UP<n> to a high level and enable the pull-down signal DN<n> to a high level. The transmission driver 461 may drive the normal through via TSVn with one of the first and second power supply voltages VDD and VSS based on the pull-up signal UP<n> and the pull-down signal DN<n>, and the transmission signal DI<n−1> allocated to be transmitted through the adjacent normal through via may be transmitted through the normal through via TSVn by being detoured.

When a defect does not exist in the plurality of through vias and the normal through via TSVn, both the entire defect information DFA and the individual defect information DF<n> may be disabled to the low levels. The multiplexer 610 may output the transmission signal DI<n> allocated to be transmitted through the normal through via TSVn, based on the entire defect information DFA which is disabled to the low level. The driver enable circuit 620 may enable the driver enable signal ENTX<n> when the output enable signal OE is enabled. The driving control signal generation circuit 630 may generate the pull-up signal UP<n> and the pull-down signal DN<n> based on the transmission signal DI<n>. The transmission driver 461 may drive the normal through via TSVn with one of the first and second power supply voltages VDD and VSS based on the pull-up signal UP<n> and the pull-down signal DN<n>, and the transmission signal DI<n> may be transmitted through the normal through via TSVn.

Figure 7:
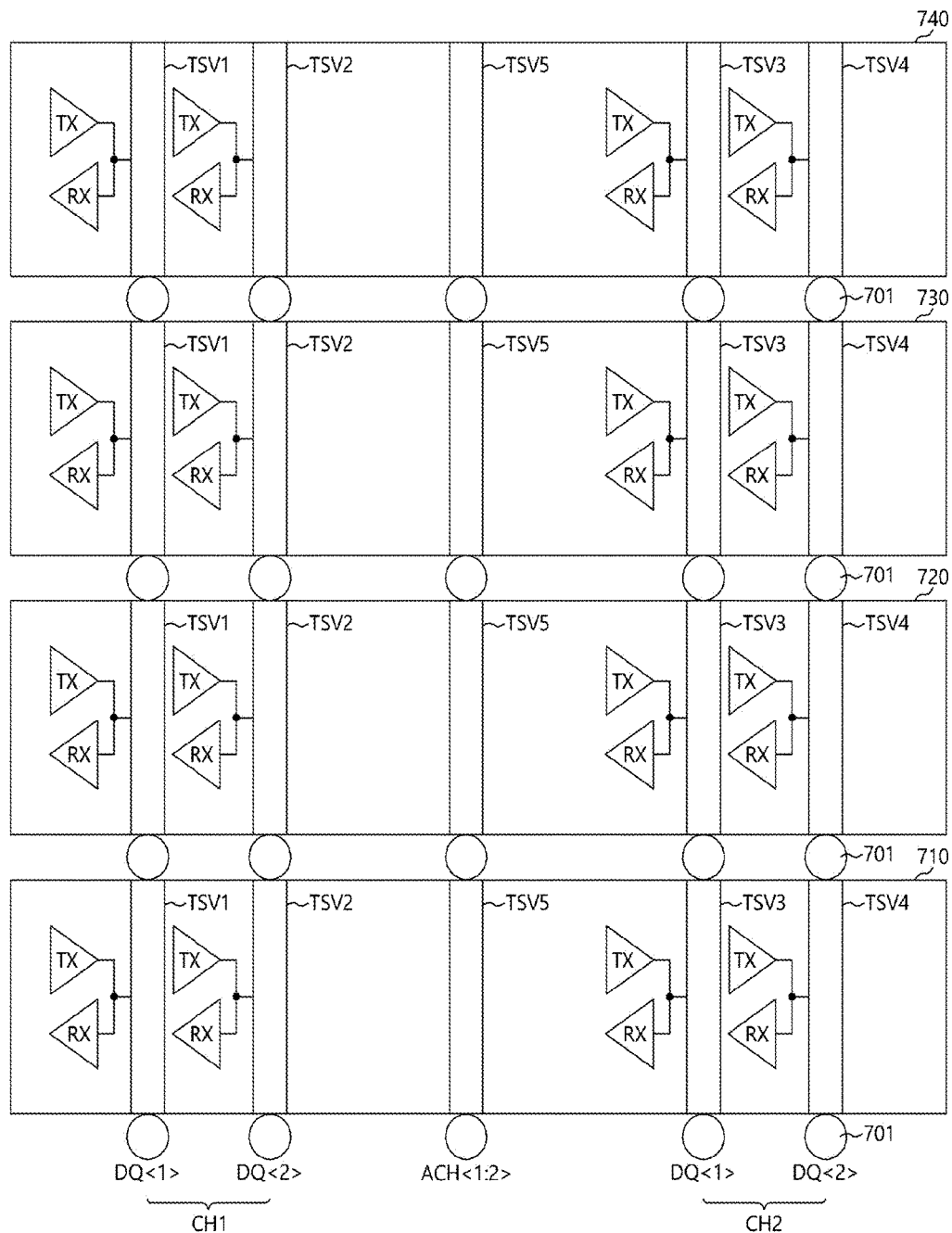
FIG. 7 is a diagram illustrating a representation of an example of the configuration of a semiconductor apparatus in accordance with an embodiment.

FIG. 7 is a diagram illustrating a representation of an example of the configuration of a semiconductor apparatus 7 in accordance with an embodiment. In FIG. 7, the semiconductor apparatus 7 may include a plurality of chips, and the plurality of chips may be stacked through vias. The semiconductor apparatus 7 may be applied as any one of the first and second semiconductor apparatuses 130 and 140 shown in FIG. 1. Hereunder, a case where the semiconductor apparatus 7 is applied as the second semiconductor apparatus 140 will be described as an example. The semiconductor apparatus 7 may include a plurality of channels. The semiconductor apparatus 7 may perform data input/output operations by being divided into the plurality of channels. The plurality of channels may independently receive command signals and address signals, and may use in common a clock signal and data. Thus, the data input/output operations of the plurality of channels may be performed independently of one another. In FIG. 7, the semiconductor apparatus 7 may include a first channel CH1 and a second channel CH2, and each of the first and second channels CH1 and CH2 may include first and second data lines DQ<1> and DQ<2>. The first and second data lines DQ<1> and DQ<2> of the first and second channels CH1 and CH2 may be coupled in common with a data bus which is coupled with an external apparatus, for example, the first semiconductor apparatus 130 shown in FIG. 1. In FIG. 7, for the sake of clarity in explanation, it is illustrated that the semiconductor apparatus 7 includes two channels and each of the two channels includes two data lines. However, it is to be noted that the embodiment is not limited thereto, and the number of channels and the number of data lines may be changed variously according to an application example.

The semiconductor apparatus 7 may include first to fourth chips 710, 720, 730 and 740, and the first to fourth chips 710, 720, 730 and 740 may be electrically coupled through first to fifth through vias TSV1, TSV2, TSV3, TSV4 and TSV5. The first to fifth through vias TSV1, TSV2, TSV3, TSV4 and TSV5 may electrically couple one chip and another chip through microbumps 701. The first through via TSV1 may be the first data line DQ<1> of the first channel CH1, and the second through via TSV2 may be the second data line DQ<2> of the first channel CH1. The third through via TSV3 may be the first data line DQ<1> of the second channel CH2, and the fourth through via TSV4 may be the second data line DQ<2> of the second channel CH2. Each of the first to fourth chips 710, 720, 730 and 740 may include a plurality of transmission circuits TX and a plurality of receiving circuits RX. In each of the first to fourth chips 710, 720, 730 and 740, the plurality of transmission circuits TX and the plurality of receiving circuits RX may be respectively coupled with the first to fourth through vias TSV1, TSV2, TSV3 and TSV4. The plurality of transmission circuits TX may transmit the data of the first to fourth chips 710, 720, 730 and 740 to the first to fourth through vias TSV1, TSV2, TSV3 and TSV4, and the plurality of receiving circuits RX may receive the signals transmitted through the first to fourth through vias TSV1, TSV2, TSV3 and TSV4.

The fifth through via TSV5 may transmit channel enable signals ACH<1:2>. The channel enable signals ACH<1:2> may be generated based on a command signal transmitted from the external apparatus, for example, the first semiconductor apparatus 130 shown in FIG. 1. The channel enable signals ACH<1:2> are signals capable of selecting a channel which is to perform a data input/output operation. For example, in the case where the first channel enable signal ACH<1> is enabled, the first channel CH1 may be activated and perform a data input/output operation. In the case where the second channel enable signal ACH<2> is enabled, the second channel CH2 may be activated and perform a data input/output operation. The channel enable signals ACH<1:2> may be inputted to the plurality of transmission circuits TX. The first channel enable signal ACH<1> may be inputted to the plurality of transmission circuits TX which are coupled with the first and second through vias TSV1 and TSV2, respectively. The second channel enable signal ACH<2> may be inputted to the plurality of transmission circuits TX which are coupled with the third and fourth through vias TSV3 and TSV4, respectively.

The plurality of transmission circuits TX which are coupled with the first and second through vias TSV1 and TSV2 may transmit data through the first and second through vias TSV1 and TSV2 or drive the first and second through vias TSV1 and TSV2 with a power supply voltage, based on the first channel enable signal ACH<1>. The plurality of transmission circuits TX which are coupled with the first and second through vias TSV1 and TSV2 may drive the first and second through vias TSV1 and TSV2 based on the data outputted from the first to fourth chips 710, 720, 730 and 740 when the first channel enable signal ACH<1> is enabled, and may drive the first and second through vias TSV1 and TSV2 with a power supply voltage when the first channel enable signal ACH<1> is disabled. The first and second through vias TSV1 and TSV2 which are driven with the power supply voltage may be utilized as additional power lines, and may provide additional power to the plurality of transmission circuits TX which are coupled with the third and fourth through vias TSV3 and TSV4, when the second channel CH2 is activated and performs a data input/output operation.

The plurality of transmission circuits TX which are coupled with the third and fourth through vias TSV3 and TSV4 may transmit data through the third and fourth through vias TSV3 and TSV4 or drive the third and fourth through vias TSV3 and TSV4 with a power supply voltage, based on the second channel enable signal ACH<2>. The plurality of transmission circuits TX which are coupled with the third and fourth through vias TSV3 and TSV4 may drive the third and fourth through vias TSV3 and TSV4 based on the data outputted from the first to fourth chips 710, 720, 730 and 740 when the second channel enable signal ACH<2> is enabled, and may drive the third and fourth through vias TSV3 and TSV4 with a power supply voltage when the second channel enable signal ACH<2> is disabled. The third and fourth through vias TSV3 and TSV4 which are driven with the power supply voltage may be utilized as additional power lines, and may provide additional power to the plurality of transmission circuits TX which are coupled with the first and second through vias TSV1 and TSV2, when the first channel CH1 is activated and performs a data input/output operation.

Figure 8:
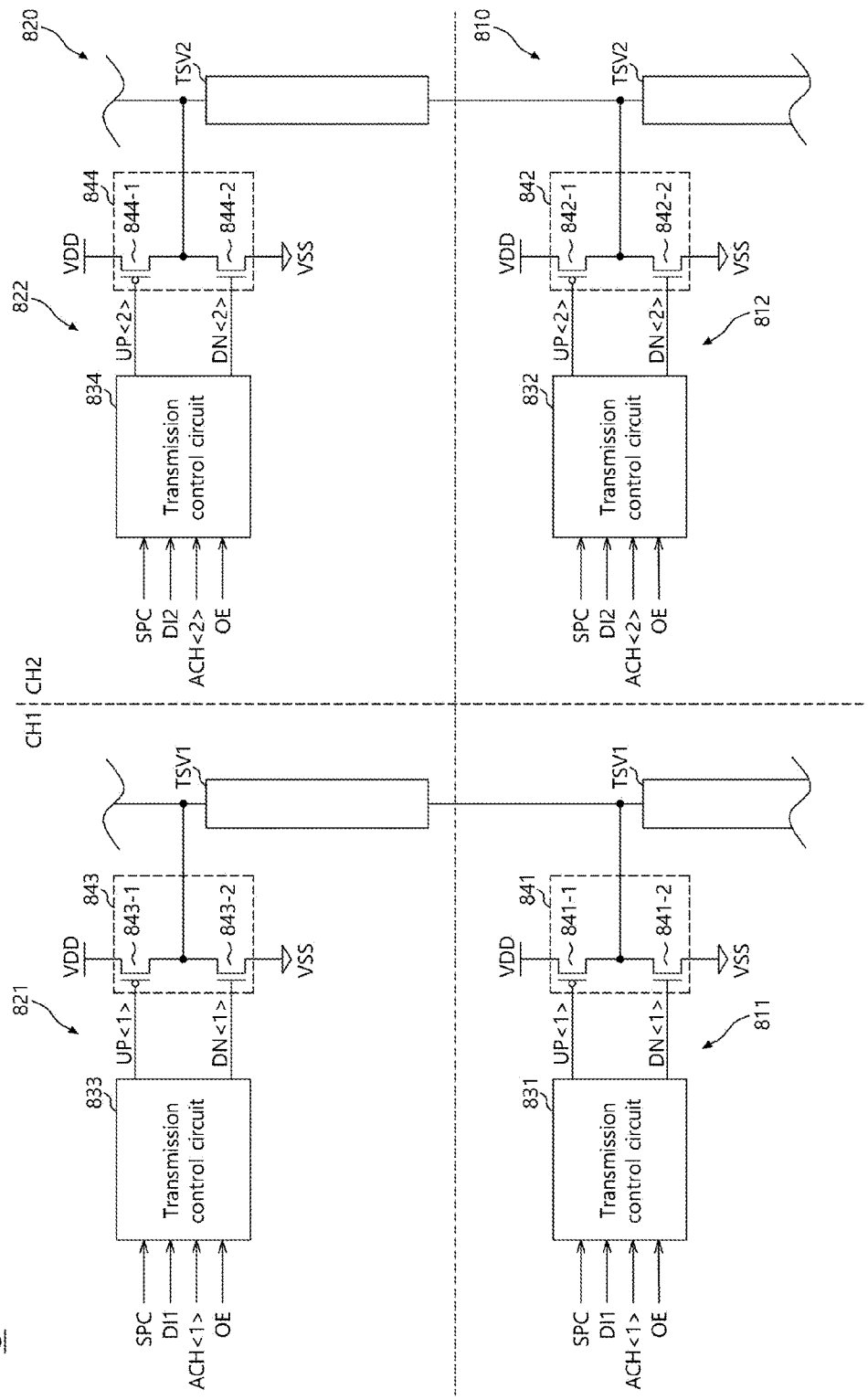
FIG. 8 is a diagram illustrating a representation of an example of the partial configuration of a semiconductor apparatus in accordance with an embodiment.

FIG. 8 is a diagram illustrating a representation of an example of the partial configuration of a semiconductor apparatus 8 in accordance with an embodiment. In FIG. 8, the semiconductor apparatus 8 may include a first chip 810 and a second chip 820. The semiconductor apparatus 8 may include a first channel CH1 and a second channel CH2. When viewed from the horizontal dotted line, the lower part may show the configuration of the first chip 810 and the upper part may show the configuration of the second chip 820. When viewed from the vertical dotted line, the left part may show the configuration of the first channel CH1 and the right part may show the configuration of the second channel CH2. The first and second chips 810 and 820 may include first through vias TSV1 which couple the first and second chips 810 and 820. The first and second chips 810 and 820 may include first transmission circuits 811 and 821 for driving the first through vias TSV1. The first and second chips 810 and 820 may include second through vias TSV2 which couple the first and second chips 810 and 820. The first and second chips 810 and 820 may include second transmission circuits 812 and 822 for driving the second through vias TSV2. The first through vias TSV1 may be the data line of the first channel CH1, and the second through vias TSV2 may be the data line of the second channel CH2.

The first transmission circuits 811 and 821 may drive the first through vias TSV1, respectively, based on a first transmission signal DI1, when the first channel CH1 is activated, such that data may be transmitted through the first through vias TSV1. The first transmission circuits 811 and 821 may drive the first through vias TSV1 with a power supply voltage when the first channel CH1 is deactivated. The first transmission circuits 811 and 821 may include transmission control circuits 831 and 833 and transmission drivers 841 and 843, respectively. The transmission control circuits 831 and 833 may receive the first transmission signal DI1, a supplemental power control signal SPC and a first channel enable signal ACH<1>. The transmission control circuits 831 and 833 may generate driving control signals UP<1> and DN<1> based on one of the first transmission signal DI1 and the supplemental power control signal SPC according to the first channel enable signal ACH<1>. The transmission control circuits 831 and 833 may generate the driving control signals UP<1> and DN<1> based on the first transmission signal DI1 when the first channel enable signal ACH<1> is enabled. The transmission control circuits 831 and 833 may generate the driving control signals UP<1> and DN<1> based on the supplemental power control signal SPC when the first channel enable signal ACH<1> is disabled. Each of the transmission control circuits 831 and 833 may further receive an output enable signal OE. The transmission drivers 841 and 843 may drive the first through vias TSV1, respectively, based on the driving control signals UP<1> and DN<1>. The driving control signals UP<1> and DN<1> may include a pull-up signal UP<1> and a pull-down signal DN<1>, and the transmission drivers 841 and 843 may include pull-up drivers 841-1 and 843-1 and pull-down drivers 841-2 and 843-2, respectively. The pull-up drivers 841-1 and 843-1 may drive the first through vias TSV1 with a first power supply voltage VDD when the pull-up signal UP<1> is enabled, and the pull-down drivers 841-2 and 843-2 may drive the first through vias TSV1 with a second power supply voltage VSS when the pull-down signal DN<1> is enabled.

The second transmission circuits 812 and 822 may drive the second through vias TSV2, respectively, based on a second transmission signal DI2, when the second channel CH2 is activated, such that data may be transmitted through the second through vias TSV2. The second transmission circuits 812 and 822 may drive the second through vias TSV2 with a power supply voltage when the second channel CH2 is deactivated. The second transmission circuits 812 and 822 may include transmission control circuits 832 and 834 and transmission drivers 842 and 844, respectively. The transmission control circuits 832 and 834 may receive the second transmission signal DI2, the supplemental power control signal SPC and a second channel enable signal ACH<2>. The transmission control circuits 832 and 834 may generate driving control signals UP<2> and DN<2> based on one of the second transmission signal DI2 and the supplemental power control signal SPC according to the second channel enable signal ACH<2>. The transmission control circuits 832 and 834 may generate the driving control signals UP<2> and DN<2> based on the second transmission signal DI2 when the second channel enable signal ACH<2> is enabled. Each of the transmission control circuits 832 and 834 may further receive the output enable signal OE. The transmission control circuits 832 and 834 may generate the driving control signals UP<2> and DN<2> based on the supplemental power control signal SPC when the second channel enable signal ACH<2> is disabled. The transmission drivers 842 and 844 may drive the second through vias TSV2, respectively, based on the driving control signals UP<2> and DN<2>. The driving control signals UP<2> and DN<2> may include a pull-up signal UP<2> and a pull-down signal DN<2>, and the transmission drivers 842 and 844 may include pull-up drivers 842-1 and 844-1 and pull-down drivers 842-2 and 844-2, respectively. The pull-up drivers 842-1 and 844-1 may drive the second through vias TSV2 with the first power supply voltage VDD when the pull-up signal UP<2> is enabled, and the pull-down drivers 842-2 and 844-2 may drive the second through vias TSV2 with the second power supply voltage VSS when the pull-down signal DN<2> is enabled.

The semiconductor apparatus 8 may transmit a transmission signal through a through via in an activated channel, and may drive a through via with a power supply voltage in a deactivated channel. Therefore, additional power may be supplied to the terminal of the power supply voltage through the through via of the deactivated channel, and the power distribution network of the semiconductor apparatus 8 may be improved. Moreover, since the power distribution network is improved through the through via of the deactivated channel, the activated channel may perform signal transmission in a precise and reliable manner.

Figure 9:
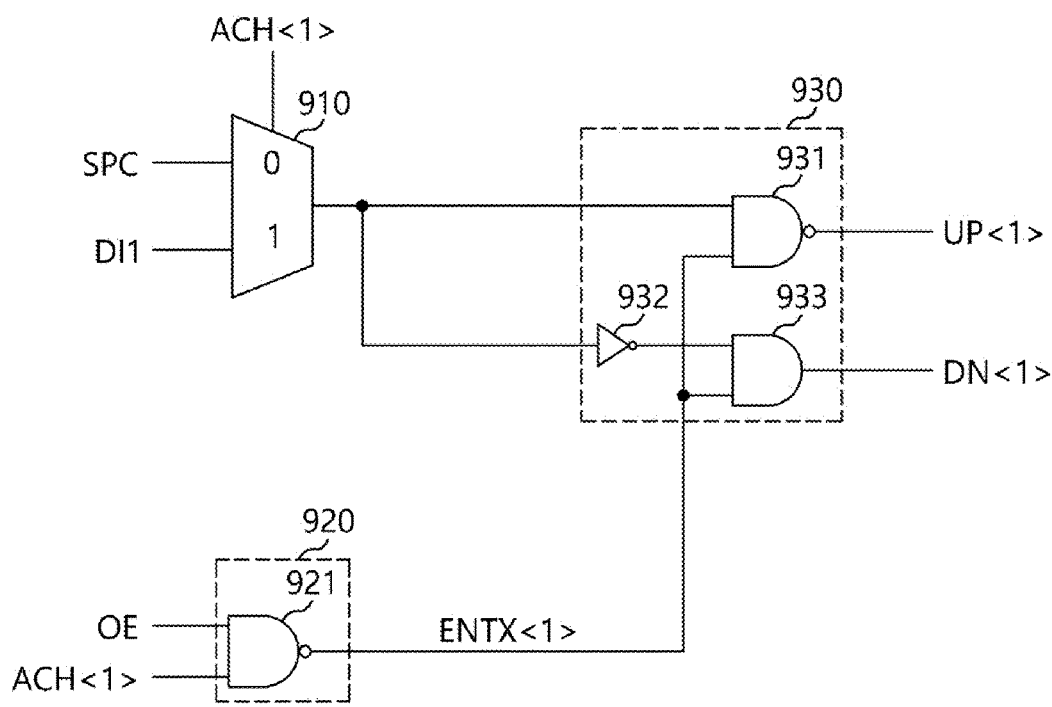
FIG. 9 is a diagram illustrating a representation of an example of the configuration of the transmission control circuit shown in FIG. 8.

FIG. 9 is a diagram illustrating a representation of an example of the configuration of the transmission control circuit 831 shown in FIG. 8. The transmission control circuit 833 may have substantially the same configuration as the transmission control circuit 831 shown in FIG. 9, and the transmission control circuits 832 and 834 may also have substantially the same configuration as the transmission control circuit 831 except that the second channel enable signal ACH<2> is received instead of the first channel enable signal ACH<1>. In FIG. 9, the transmission control circuit 831 may include a multiplexer 910, a driver enable circuit 920 and a driving control signal generation circuit 930. The multiplexer 910 may receive the first channel enable signal ACH<1>, the first transmission signal DI1 and the supplemental power control signal SPC, and may output one of the first transmission signal DI1 and the supplemental power control signal SPC based on the first channel enable signal ACH<1>.

The driver enable circuit 920 may receive the first channel enable signal ACH<1> and the output enable signal OE. The driver enable circuit 920 may include, for example to but not limited to, a NAND gate 921. The NAND gate 921 may generate a driver enable signal ENTX<1> based on the first channel enable signal ACH<1> and the output enable signal OE. The driver enable circuit 920 may enable the driver enable signal ENTX<1> to a high level based on the output enable signal OE when the first channel enable signal ACH<1> is enabled to a high level. The driver enable circuit 920 may enable the driver enable signal ENTX<1> to the high level regardless of the output enable signal OE when the first channel enable signal ACH<1> is disabled to a low level.

The driving control signal generation circuit 930 may generate the driving control signals UP<1> and DN<1> based on the output of the multiplexer 910 and the driver enable signal ENTX<1>. The driving control signal generation circuit 930 may include, for example but not limited to, a NAND gate 931, an inverter 932 and an AND gate 933. The NAND gate 931 may receive the output of the multiplexer 910 and the driver enable signal ENTX<1>, and generate the pull-up signal UP<1>. The inverter 932 may invert the output of the multiplexer 910 and output an output. The AND gate 933 may receive the output of the inverter 932 and the driver enable signal ENTX<1>, and generate the pull-down signal DN<1>.

The transmission control circuit 831 and the transmission circuit 811 may operate as follows. When the first channel enable signal ACH<1> is enabled to the high level, the multiplexer 910 may output the first transmission signal DI1. The driver enable circuit 920 may enable the driver enable signal ENTX<1> to the high level when the output enable signal OE is enabled to a low level. The driving control signal generation circuit 930 may generate the pull-up signal UP<1> and the pull-down signal DN<1> based on the first transmission signal DI1 which is outputted from the multiplexer 910, when the driver enable signal ENTX<1> is enabled. When the first transmission signal DI1 is a high level, the pull-up signal UP<1> may be enabled to a low level and the pull-down signal DN<1> may be disabled to a low level. The pull-up driver 841-1 of the transmission driver 841 may drive the first through via TSV1 with the first power supply voltage VDD based on the pull-up signal UP<1>, and the first transmission signal DI1 of the high level may be transmitted through the first through via TSV1. When the first transmission signal DI1 is a low level, the pull-up signal UP<1> may be disabled to a high level and the pull-down signal DN<1> may be enabled to a high level. The pull-down driver 841-2 of the transmission driver 841 may drive the first through via TSV1 with the second power supply voltage VSS based on the pull-down signal DN<1>, and the first transmission signal DI1 of the low level may be transmitted through the first through via TSV1.

When the first channel enable signal ACH<1> is disabled to the low level, the multiplexer 910 may output the supplemental power control signal SPC, and the driver enable circuit 920 may enable the driver enable signal ENTX<1> regardless of the output enable signal OE. The driving control signal generation circuit 930 may enable one of the pull-up signal UP<1> and the pull-down signal DN<1> based on the supplemental power control signal SPC, and the first through via TSV1 may be driven with one of the first power supply voltage VDD and the second power supply voltage VSS. Therefore, when the first channel CH1 is deactivated, the first through via TSV1 may be utilized as an additional power line, and a data input/output operation may be performed precisely and reliably in the activated second channel CH2.

While various embodiments have been described above, it will be understood to those skilled in the art that the embodiments described are examples only. Accordingly, the stacked semiconductor apparatus and the semiconductor system described herein should not be limited based on the described embodiments.

What is claimed is:

1. A semiconductor apparatus comprising:
a normal through via and a redundancy through via coupling a first chip and a second chip; and a transmission circuit configured to detour a transmission signal which is allocated to be transmitted through the normal through via, to the redundancy through via, when a defect exists in the normal through via, and drive the redundancy through via with a power supply voltage, when a defect does not exist in the normal through via.

2. The semiconductor apparatus according to claim 1, wherein the transmission circuit comprises:
   a redundancy control circuit configured to generate driving control signals based on one of the transmission signal and a supplemental power control signal according to through via defect information; and
   a transmission driver configured to drive the redundancy through via based on the driving control signals.

3. The semiconductor apparatus according to claim 2, wherein the redundancy control circuit comprises:
   a multiplexer configured to output one of the transmission signal and the supplemental power control signal based on an entire defect information;
   a driver enable circuit configured to generate a driver enable signal based on the entire defect information or generate the driver enable signal based on an individual defect information and an output enable signal; and
   a driving control signal generation circuit configured to generate a pull-up signal and a pull-down signal based on an output of the multiplexer and the driver enable signal.

4. The semiconductor apparatus according to claim 3, wherein the transmission driver comprises:
   a pull-up driver configured to drive the redundancy through via with a first power supply voltage based on the pull-up signal; and
   a pull-down driver configured to drive the redundancy through via with a second power supply voltage based on the pull-down signal.

5. A semiconductor apparatus comprising:
   a first through via, a second through via and a redundancy through via coupling a first chip and a second chip; and
   a first transmission circuit configured to detour a first transmission signal which is allocated to be transmitted through the second through via, to the redundancy through via, when a defect exists in any one of the first and second through vias, and drive the redundancy through via with a power supply voltage when a defect does not exist in the first and second through vias.

6. The semiconductor apparatus according to claim 5, wherein the first transmission circuit comprises:
   a redundancy control circuit configured to generate driving control signals based on one of the first transmission signal and a supplemental power control signal according to through via defect information; and
   a transmission driver configured to drive the redundancy through via based on the driving control signals.

7. The semiconductor apparatus according to claim 6, wherein the redundancy control circuit comprises:
   a multiplexer configured to output one of the first transmission signal and the supplemental power control signal based on an entire defect information;
   a driver enable circuit configured to generate a driver enable signal based on the entire defect information or generate the driver enable signal based on an individual defect information and an output enable signal; and
   a driving control signal generation circuit configured to generate a pull-up signal and a pull-down signal based on an output of the multiplexer and the driver enable signal.

8. The semiconductor apparatus according to claim 7, wherein the transmission driver comprises:
   a pull-up driver configured to drive the redundancy through via with a first power supply voltage based on the pull-up signal; and
   a pull-down driver configured to drive the redundancy through via with a second power supply voltage based on the pull-down signal.

9. The semiconductor apparatus according to claim 5, further comprising:
   a second transmission circuit configured to drive the second through via based on a second transmission signal which is allocated to be transmitted through the first through via, when a defect exists in the first through via, and drive the second through via based on the first transmission signal when a defect does not exist in the first and second through vias.

10. The semiconductor apparatus according to claim 9, wherein the second transmission circuit comprises:
    a transmission control circuit configured to generate driving control signals based on one of the second transmission signal and the first transmission signal according to through via defect information; and
    a transmission driver configured to drive the second through via based on the driving control signals.

11. The semiconductor apparatus according to claim 10, wherein the transmission control circuit comprises:
    a multiplexer configured to output one of the second transmission signal and the first transmission signal based on an entire defect information;
    a driver enable circuit configured to generate a driver enable signal based on an individual defect information and an output enable signal; and
    a driving control signal generation circuit configured to generate a pull-up signal and a pull-down signal based on an output of the multiplexer and the driver enable signal.

12. The semiconductor apparatus according to claim 11, wherein the transmission driver comprises:
    a pull-up driver configured to drive the second through via with a first power supply voltage based on the pull-up signal; and
    a pull-down driver configured to drive the second through via with a second power supply voltage based on the pull-down signal.

13. A semiconductor apparatus comprising:
    a first through via included in a first channel and coupling a first chip and a second chip;
    a first transmission circuit configured to transmit a first signal through the first through via based on the first channel being activated and supply a power supply voltage through the first through via based on the first channel being deactivated.

14. The semiconductor apparatus according to claim 13, further comprising:
    a second through via provided in a second channel and coupling the first chip and the second chip;
    a second transmission circuit configured to transmit a second signal through the second through via based on the second channel being activated and supply a power supply voltage through the second through via based on the second channel being deactivated.

15. The semiconductor apparatus according to claim 14, wherein the second transmission circuit transmits the second signal through the second through via by driving the second through via based on a first transmission signal, and wherein the second transmission circuit supplies the power supply voltage through the second through via by driving the second through via with the power supply voltage.

16. The semiconductor apparatus according to claim 13, wherein the first transmission circuit transmits the first signal through the first through via by driving the first through via based on a first transmission signal, and
wherein the first transmission circuit supplies the power supply voltage through the first through via by driving the first through via with the power supply voltage.

17. The semiconductor apparatus according to claim 16, wherein the first transmission circuit comprises:
   a transmission control circuit configured to generate driving control signals based on one of the first transmission signal and a supplemental power control signal according to a first channel enable signal; and
   a transmission driver configured to drive the first through via based on the driving control signals.

18. The semiconductor apparatus according to claim 17, wherein the transmission control circuit comprises:
   a multiplexer configured to output one of the first transmission signal and the supplemental power control signal based on the first channel enable signal;
   a driver enable circuit configured to generate a driver enable signal based on the first channel enable signal and an output enable signal; and
   a driving control signal generation circuit configured to generate a pull-up signal and a pull-down signal based on an output of the multiplexer and the driver enable signal.

19. The semiconductor apparatus according to claim 18, wherein the transmission driver comprises:
   a pull-up driver configured to drive the first through via with a first power supply voltage based on the pull-up signal; and
   a pull-down driver configured to drive the first through via with a second power supply voltage based on the pull-down signal.

20. A semiconductor apparatus comprising:
   a through via and a redundancy through via coupling a first chip and a second chip; and
   a transmission circuit configured to perform a repair operation for the through via with the redundancy through via or supply the redundancy through via with a power supply voltage based on through via defect information.

* * * * *